United States Patent
Wang et al.

(10) Patent No.: US 12,279,442 B2
(45) Date of Patent: Apr. 15, 2025

(54) LDMOS TRANSISTOR AND MANUFACTURING METHOD THEREOF

(71) Applicant: Hangzhou Silicon-Magic Semiconductor Technology Co., Ltd., Hangzhou (CN)

(72) Inventors: Jiakun Wang, Hangzhou (CN); Bing Wu, Hangzhou (CN)

(73) Assignee: Hangzhou Silicon-Magic Semiconductor Technology Co., Ltd, Hangzhou (CN)

( * ) Notice: Subject to any disclaimer, the term of this patent is extended or adjusted under 35 U.S.C. 154(b) by 649 days.

(21) Appl. No.: 17/508,251

(22) Filed: Oct. 22, 2021

(65) Prior Publication Data

US 2022/0130981 A1 Apr. 28, 2022

(30) Foreign Application Priority Data

Oct. 23, 2020 (CN) .......................... 202011142593.7

(51) Int. Cl.
*H01L 29/66* (2006.01)
*H01L 21/765* (2006.01)
(Continued)

(52) U.S. Cl.
CPC ....... *H10D 30/0281* (2025.01); *H01L 21/765* (2013.01); *H10D 30/65* (2025.01); *H10D 62/393* (2025.01); *H10D 64/111* (2025.01)

(58) Field of Classification Search
CPC ............. H01L 29/66681; H01L 21/765; H01L 29/1095; H01L 29/402; H01L 29/7816;
(Continued)

(56) References Cited

U.S. PATENT DOCUMENTS

2001/0028095 A1* 10/2001 Yin ...................... H01L 21/0276
257/411
2019/0229212 A1* 7/2019 Wu ....................... H01L 29/7835
(Continued)

FOREIGN PATENT DOCUMENTS

CN 108172621 A 6/2018
CN 109585572 A 4/2019
(Continued)

OTHER PUBLICATIONS

CN 202011142593.7 Office Action mailed Jun. 8, 2023.

*Primary Examiner* — Erik T. K. Peterson
*Assistant Examiner* — Christopher A. Schodde
(74) *Attorney, Agent, or Firm* — Osha Bergman Watanabe & Burton LLP

(57) ABSTRACT

A LDMOS transistor and manufacturing method includes: forming an epitaxial layer on a substrate of a first doping type; forming a gate structure on an upper surface of the epitaxial layer; forming a source region of a second doping type in the epitaxial layer, the second doping type is opposite to the first doping type; forming a patterned first insulating layer on the upper surface of the epitaxial layer and the gate structure, and at least exposes part of the source region; forming a first conductive channel by using a sidewall as a mask, the first conductive channel extends from the source region to an upper surface of the substrate so as to connect the source region with the substrate; and forming a drain region of the second doping type in the epitaxial layer.

13 Claims, 5 Drawing Sheets

(51) Int. Cl.
    *H01L 29/10*     (2006.01)
    *H01L 29/40*     (2006.01)
    *H01L 29/417*     (2006.01)
    *H01L 29/78*     (2006.01)
    *H10D 30/01*     (2025.01)
    *H10D 30/65*     (2025.01)
    *H10D 62/17*     (2025.01)
    *H10D 64/00*     (2025.01)

(58) Field of Classification Search
    CPC . H01L 29/7835; H01L 29/4175; H01L 29/00; H01L 29/78; H01L 29/739; H01L 21/8234; H01L 21/336; H01L 21/321; H01L 27/115; H01L 29/165; H01L 29/423
    See application file for complete search history.

(56) References Cited

U.S. PATENT DOCUMENTS

| | | | |
|---|---|---|---|
| 2021/0159324 A1 | 5/2021 | Wang et al. | |
| 2021/0265376 A1* | 8/2021 | Hsu | H01L 29/66689 |
| 2022/0262948 A1* | 8/2022 | Jin | H01L 29/404 |

FOREIGN PATENT DOCUMENTS

| | | |
|---|---|---|
| CN | 110896026 A | 3/2020 |
| CN | 111554746 A | 8/2020 |
| CN | 111710608 A | 9/2020 |
| CN | 112582260 A | 3/2021 |

\* cited by examiner

LDMOS TRANSISTOR AND MANUFACTURING METHOD THEREOF

CROSS-REFERENCE TO RELATED APPLICATION

This application claims priority to the Chinese Patent Application No. 2020111425937, filed on Oct. 23, 2020 and entitled "LDMOS transistor and manufacturing method thereof", which are incorporated herein by reference in its entirety in this disclosure.

BACKGROUND OF THE DISCLOSURE

Field of Technology

The present disclosure relates to the technical field of semiconductors, in particular to a laterally diffused metal oxide semiconductor (LDMOS) transistor and manufacturing method thereof.

Description of the Related Art

In various electronic systems, voltage regulators, such as DC to DC voltage converters, are used to provide a stable voltage source. Battery management in low power devices (e.g., notebooks, mobile phones, etc.) particularly requires a high efficiency DC to DC converter. A switching type voltage regulator generates an output voltage by converting an input DC voltage to a high frequency voltage and then filtering the high frequency input voltage to generate an output DC voltage. Particularly, a switching regulator includes a power switch for alternately coupling and decoupling a DC voltage source (e.g., a battery) to a load (e.g., an Integrated Circuit (IC)).

The power switch may be a semiconductor device including a Metal Oxide Semiconductor Field Effect Transistor (MOSFET), an Insulated Gate Bipolar Transistor (IGBT), and the like. A source region of a LDMOS transistor is formed in a body region of a doping type opposite to a conductivity type of the LDMOS transistor, and a drain region is formed in a drift region of high resistance of a same doping type as the conductivity type of the device. Due to the drift region, a drain of the LDMOS transistor can withstand high voltages. Therefore, the LDMOS transistor has advantages of a large drive current, a low on-resistance, and a high breakdown voltage, and is widely used for a switching regulator.

The LDMOS transistor of the prior art, as shown in FIG. 1, includes a P substrate 901, a P epitaxial layer 902, a P doped region 903, a P body region 904, an N drift region 905, a source region 906, a drain region 907, a gate 908, a source electrode 909, and a drain electrode 910. In a conventional process for forming the LDMOS transistor, the source region 902 located on an upper surface of the P epitaxial layer 902 and the P substrate 901 are connected by the P doped region 903 located on the P epitaxial layer 902, so that the source electrode 909 can be located on a lower surface of the P substrate 901. A process for implementing the structure generally includes one or more ion implantations, and then a high temperature push junction is performed, so that the P doped region 903 diffuses toward the lower surface of the P epitaxial layer 902.

However, when the P-doped region 903 in the LDMOS transistor is diffused at a high temperature, not only longitudinal diffusion occurs, but also lateral diffusion occurs, which makes it difficult to reduce a size of the LDMOS transistor, and in addition, a resistance of the P-doped region 903 itself may also adversely affect the LDMOS transistor, thereby affecting a product performance.

SUMMARY

In summary, the present disclosure provides a LDMOS transistor and manufacturing method thereof to reduce the size of the LDMOS transistor, reduce the resistance, and improve the product performance.

According to an aspect of the present disclosure, there is provided a method for manufacturing a LDMOS transistor, comprising: forming an epitaxial layer on a substrate of a first doping type; forming a gate structure on an upper surface of the epitaxial layer; forming a source region of a second doping type in the epitaxial layer, wherein the second doping type is opposite to the first doping type; forming a patterned first insulating layer on the upper surface of the epitaxial layer and the gate structure, wherein the patterned first insulating layer at least comprises a sidewall covering a side surface of the gate structure close to the source region, and at least exposes part of the source region; forming a first conductive channel by using the sidewall as a mask, wherein the first conductive channel extends from the source region to an upper surface of the substrate so as to connect the source region with the substrate; and forming a drain region of the second doping type in the epitaxial layer.

Preferably, a step of forming the patterned first insulating layer comprises: forming a first insulating layer covering the upper surface of the epitaxial layer and an upper surface and the side surface of the gate structure; forming a patterned mask layer on the first insulating layer, wherein the patterned mask layer exposes the first insulating layer above the source region and part of the gate structure; and partially etching the first insulating layer exposed by the patterned mask layer by adopting an etching process to form the sidewall covering the side surface of the gate structure.

Preferably, a step of forming the first conductive channel comprises: self-alignment etching the epitaxial layer to form a first trench by using the sidewall, the gate structure and the patterned mask layer as masks by an etching process; and filling a first conductive material in the first trench to form the first conductive channel.

Preferably, part of the sidewall, part of the gate structure, and part of the patterned mask layer are etched while the epitaxial layer is etched.

Preferably, a topmost layer of the gate structure comprises a first barrier layer, the epitaxial layer and the first barrier layer having a high etch selectivity.

Preferably, prat of the first barrier layer at the topmost layer of the gate structure is at least etched.

Preferably, a topmost layer of the gate structure comprises nitride.

Preferably, the etching process is an anisotropic etching process.

Preferably, further comprising: forming a body contact region of the first doping type in the substrate exposed by the first trench before filling the first trench, the body contact region being connected to the source region by the first conductive channel.

Preferably, further comprising: removing the patterned mask layer remained on the first insulating layer after etching.

Preferably, further comprising: depositing a second conductive material on the first conductive channel, the gate structure, and the patterned first insulating layer, etching part of the second conductive material close to the drain region to form a shielding conductor layer, wherein the shielding conductor layer is electrically connected with the first conductive channel.

Preferably, a step of forming the drain region comprises: depositing a second insulating layer on the shield conductor layer and the patterned first insulating layer; sequentially etching part of the second insulating layer and part of the patterned first insulating layer to form a second trench; and forming the drain region extending from the upper surface of the epitaxial layer to an interior of the epitaxial layer by use of the second trench.

Preferably, further comprising: filling the second trench with a third conductive material to form a second conductive channel, and forming a drain electrode on an upper surface of the second insulating layer so that the second conductive channel connects the drain region and the drain electrode.

Preferably, a step of forming the gate structure comprises: forming a gate dielectric layer on the upper surface of the substrate, forming a gate conductor on the gate dielectric layer, forming a silicide layer on the gate conductor, forming a third insulating layer on the silicide layer, and forming the first barrier layer on the third insulating layer, and sequentially etching the first barrier layer, the third insulating layer, the silicide layer and the gate conductor to form the gate structure on the upper surface of the substrate.

Preferably, before forming the source region, further comprising: doping the first doping type in a first region of the epitaxial layer by taking the gate structure as a mask to form a body region extending from the upper surface of the epitaxial layer to an interior of the epitaxial layer, wherein the source region is located in the body region, and the body region at least partially extends to the epitaxial layer below the gate structure.

Preferably, before forming the source region, further comprising: doping the second doping type in a second region of the epitaxial layer by taking the gate structure as a mask to form a drift region extending from the upper surface of the substrate into an interior of the substrate, wherein the drain region is located in the drift region.

Preferably, further comprising: forming a source electrode on a lower surface of the substrate, wherein the source electrode is electrically connected with the source region through the first conductive channel.

According to another aspect of the present disclosure, there is provided an LDMOS transistor comprising: an epitaxial layer on a substrate of a first doping type; a gate structure on an upper surface of the epitaxial layer; a source region of a second doping type in the epitaxial layer, wherein the second doping type is opposite to the first doping type; a patterned first insulating layer on the upper surface of the epitaxial layer and the gate structure, wherein the patterned first insulating layer at least comprises a sidewall covering a side surface of the gate structure close to the source region; a first conductive channel extending from the source region to an upper surface of the substrate, wherein the source region is connected with the substrate through the first conductive channel; a shield conductor layer covering the first conductive channel and the patterned first insulating layer; and a drain region in the epitaxial layer.

Preferably, the first conductive channel is formed self-aligned by use of the sidewall as a mask.

Preferably, the patterned first insulating layer exposes at least part of an upper surface of the gate structure.

Preferably, the first conductive channel is in contact with prat of a side surface of the sidewall.

Preferably, the shield conductor layer exposes the patterned first insulating layer close to the drain region.

Preferably, further comprising: a body contact region of the first doping type in the substrate, the first conductive channel connecting the body contact region and the source region.

Preferably, further comprising: a body region of the first doping type in a first region of the epitaxial layer extending from the upper surface of the epitaxial layer to an interior of the epitaxial layer, wherein the source region is located in the body region, and the body region at least partially extends to the epitaxial layer below the gate structure.

Preferably, further comprising: a drift region of the second doping type in a second region of the epitaxial layer extending from the upper surface of the epitaxial layer to an interior of the epitaxial layer, wherein the drain region is located in the drift region.

Preferably, further comprising: a second insulating layer on the shielding conductor layer and the patterned first insulating layer; a drain electrode on an upper surface of the second insulating layer; and a second conductive channel connecting the drain region and the drain electrode, the second conductive channel extending from the second insulating layer to the drain region.

Preferably, the gate structure comprises: a gate dielectric layer on the upper surface of the substrate, a gate conductor on the gate dielectric layer, a silicide layer on the gate conductor, a third insulating layer on the silicide layer, and a first barrier layer on the third insulating layer, at least dimensions of the gate dielectric layer, the gate conductor, the silicide layer and the third insulating layer correspond.

Preferably, the gate dielectric layer, the gate conductor, the silicide layer and the third insulating layer is of a same width, and a width of the first barrier layer is less than a width of the third insulating layer.

Preferably, the shield conductor layer is sequentially in contact with an upper surface of the first conductive channel, the sidewall, an upper surface of the third insulating layer, a side surface of the first barrier layer, an upper surface of the patterned first insulating layer.

Preferably, part of an upper surface of the third insulating layer close to the source region is exposed by the first barrier layer.

Preferably, the first barrier layer is a nitride.

Preferably, further comprising: a source electrode located on a lower surface of the substrate.

According to the method for manufacturing the LDMOS transistor, the first conductive channel is formed by using the sidewall as the mask and adopting the self-alignment process, so that the distance between the source region and the gate electrode can be ensured to be equal to the width of the sidewall, the lateral body resistance under the source region is reduced, and an improvement of EAS (avalanche energy) is facilitated; meanwhile, alignment deviation between the first conductive channel and the gate electrode is effectively avoided, and problem of process consistency is solved; and the field plate is directly contacted with the upper surface of the first conductive channel, so that the field plate and the upper surface of the first conductive channel are better in contact, the stability of the process is improved, and the product performance is improved.

BRIEF DESCRIPTION OF THE DRAWINGS

The above and other objectives, features and advantages of the present disclosure will become more apparent from the following description of embodiments of the present disclosure below with reference to the accompanying drawings, in which.

DETAILED DESCRIPTION OF THE DISCLOSURE

Figure 1:
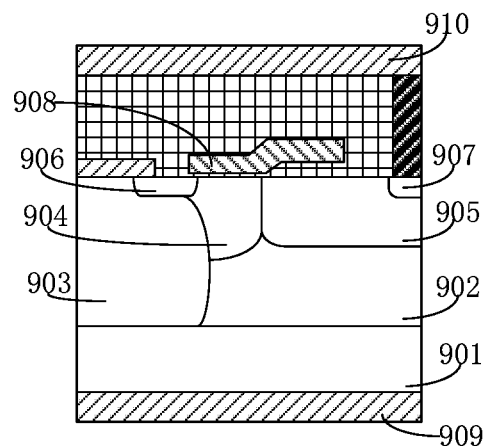
FIG. 1 shows a cross-sectional view of an LDMOS transistor according to the prior art.

Various embodiments of the present disclosure will be described in more detail below with reference to the accompanying drawings. In the various accompanying drawings, the same elements are denoted by the same or similar reference numerals. For purposes of clarity, the various parts in the accompanying drawings are not drawn to scale. In addition, some well-known parts may not be shown. For simplicity, a semiconductor structure obtained after several steps may be described in one figure.

During description of the structure of a device, when a layer or a region is called "on" or "above" another layer or another region, it may be directly on another layer or another region, or other layers or regions are included between it and another layer or another region. In addition, if the device is turned over, the layer and the region will be located "under" or "below" another layer and another region.

In order to describe the situation of being directly on another layer and another region, the specification uses the expression of "A is directly on B" or "A is on B and adjacent to B". In the present disclosure, "A is directly located in B" means that A is located in B, and A is directly adjacent to B, rather than that A is located in a doped region formed in B.

In the present disclosure, the term "wire punching" refers to a phenomenon in which, after a chip is fixed on a lead frame and wire bonding is performed, leads adjacent to each other contact each other due to impact of an encapsulant during injection of the encapsulant, resulting in short circuit.

In the following, many specific details of the present disclosure are described, such as the structure, material, size, processing technology and technology of the device, in order to understand the present disclosure more clearly. However, as those skilled in the art can understand, the present disclosure may not be implemented according to these specific details.

The LDMOS transistor of the embodiment of the present disclosure refers to a laterally diffused metal insulator semiconductor transistor.

Figure 2:
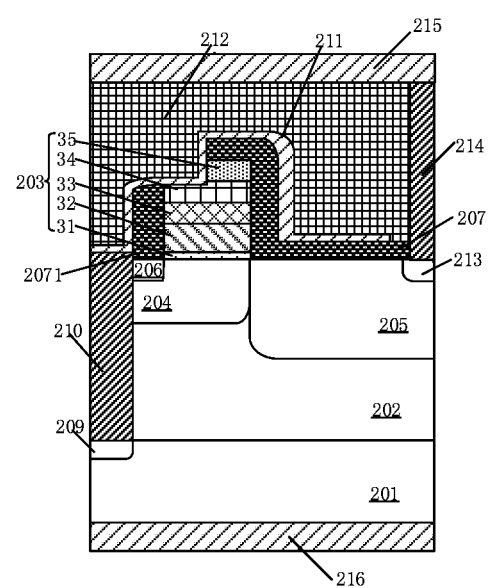
FIG. 2 shows a cross-sectional view of an LDMOS transistor according to an embodiment of the present disclosure.

FIG. 2 shows a cross-sectional view of an LDMOS transistor according to an embodiment of the present disclosure.

Referring to FIG. 2, a substrate 201 is formed by, for example, silicon and is of a first doping type. The first doping type is one of an N-type and a P-type, and a second doping type is another of the N-type and the P-type. To form an N-type epitaxial semiconductor layer or region, N-type dopants (e.g., Phosphorus, Arsenic) may be implanted in the epitaxial semiconductor layer and region. To form a P-type epitaxial layer 202 or region, a P-type dopant (e.g., Boron) may be doped in the epitaxial layer 202 and region. In an example, the substrate 201 is doped P-type.

The epitaxial layer 202 of the first doping type is located on an upper surface of the substrate 201, the epitaxial layer 202 is formed by, for example, silicon. Epitaxial layer 202 is a lightly doped layer with respect to substrate 201. A lower surface (opposite to the upper surface) of the substrate 201 is thinned by a thinning technique so that a source electrode 216 is located on the lower surface of the substrate 201. The substrate 201 include a first region and a second region, and the epitaxial layer 202 include a first region and a second region, the first regions are located on one side of a gate structure 203, and the second regions are located on another side of the gate structure 203. A body contact region 209 of the first doping type is located within the substrate 201, specifically located within the first region of the substrate 201. The first region of the substrate 201 corresponds to the first region of the epitaxial layer 202, that is, the first region of the epitaxial layer 202 is located above the first region of the substrate 201; the second region of the substrate 201 corresponds to the second region of the epitaxial layer 202, that is, the second region of the epitaxial layer 202 is located above the second region of the substrate 201.

A body region 204 of the first doping type is located in epitaxial layer 202, specifically, in the first region of the epitaxial layer 202. A drift region 205 of the second doping type is located in epitaxial layer 202, specifically, in the second region of the epitaxial layer 202. The body region 204 and the drift region 205 may be in contact within epitaxial layer 202. A source region 206 is located in the first region of the epitaxial layer 202, specifically, in the body region 204, body region 204 separating the source region 206 from the drift region 205. A drain region 213 is located in the second region of the epitaxial layer 202, specifically, in the drift region 205.

The gate structure 203 is located on an upper surface of the epitaxial layer 202, and further, the gate structure 203 is located at least over the body region 204. Wherein the gate structure 203 includes a gate dielectric layer 31, a gate conductor 32, a silicide layer 33, a third insulating layer 34 and a first barrier layer 35. The gate dielectric layer 31 separates the gate conductor 32 from the epitaxial layer 202, the silicide layer 33 is located on the gate conductor 32, the third insulating layer 34 is located on the silicide layer 33, and the first barrier layer 35 is located on the third insulating layer 34. At least dimensions of the gate dielectric layer 31, the gate conductor 32, the silicide layer 33 and the third insulating layer 34 are at correspond, that is, at least the gate dielectric layer 31, the gate conductor 32, the silicide layer 33 and the third insulating layer 34 have is of a same width. A width of the first barrier layer 35 is equal to or less than a width of the third insulating layer 34. Specifically, in the present embodiment, the first barrier layer 35 is located on a part of the third insulating layer 34, that is, the width of the first barrier layer 35 is smaller than the width of the third insulating layer 34. An upper surface of a part of the third insulating layer 34 close to the source region 206 is exposed by the first barrier layer 35. Further, a thickness of the part of the third insulating layer 34 exposed by the first barrier layer 35 is less than or equal to a thickness of a part thereof covered by the first barrier layer 35.

A first insulating layer 207 is a field insulating layer of the LDMOS transistor, and is located on the epitaxial layer 202 and a part of the gate structure 203, specifically, the first insulating layer 207 includes a first horizontal part located on the epitaxial layer 202, vertical parts located on two sidewall of the gate structure 203, and a second horizontal part located on the gate structure 203, specifically, the first insulating layer 207 includes a first part and a second part, the first part is located on the drift region 205, a sidewall of the gate structure close to one side of the drift region and the first barrier layer 35, the second part is located on a sidewall of the gate structure close to one side of the source region, and the second part serves as a sidewall 2071. The sidewall 2071 covers the source region 206, and a side edge of the sidewall 2071 away from the gate structure is aligned with a side edge of the source region 206 away from the gate structure.

In another embodiment, the gate dielectric layer 31, the gate conductor 32, the silicide layer 33, the third insulating layer 34 and the first barrier layer 35 of the gate structure may have the same width. The first insulating layer 207 may also cover an entire upper surface of the gate structure.

A first conductive channel 210 extends from the source region 206 to the body contact region 209 in the substrate 201 so that the first conductive channel 210 is in contact with the body contact region 209. Further, the first conductive channel 210 may extend from the sidewall 2071 to the body contact region 209 in the substrate 201, that is, the first conductive channel 210 may contact a part of the sidewall 2071. The first conductive channel 210 passes through the source region 206, the body region 204, and the epitaxial layer 202 from top to bottom, thereby connecting the source region 206 to the substrate 201. The first conductive channel 210 is formed by self-alignment by using the sidewall 2071 as a mask.

A shielding conductor layer 211 is located on the first insulating layer 207, specifically, the shielding conductor layer 211 sequentially contacts with an upper surface of the first conductive channel 210, a side surface and an upper surface of the sidewall 2071, a part of an upper surface of the third insulating layer 34, a side surface of the first barrier layer 35, and the upper surface of the first part of the first insulating layer 207. The shielding conductor layer 211 exposes a part of the first insulating layer 207 above the drift region 205, and the shielding conductor layer 211 serves as a field plate of the LDMOS transistor. The first conductive channel 210 electrically connects shield conductor layer 211, source region 206 and body contact region 209 so that the field plate of the LDMOS transistor is at the same potential as source region 230, for example, at ground potential.

A second insulating layer 212 is located on the shielding conductor layer 211 and the part of the first insulating layer 207 exposed by the shielding conductor layer 211. A second conductive channel 214 extends from the second insulating layer 212 in the direction of the epitaxial layer 202, and passes through the second insulating layer 212, the first insulating layer 207, and finally contacts the drain region 213. A drain electrode 215 is positioned on the second insulating layer 212 and the second conductive channel 214 to be electrically connected to the drain region 213 through the second conductive channel 214.

According to the LDMOS transistor provided by the embodiment of the disclosure, the first conductive channel with high aspect ratio is positioned in the first region of the epitaxial layer and connects the source region and the substrate, so that the source electrode may be positioned on the lower surface of the substrate. The high, deep and wide first conductive channel can not only reduce a size of the LDMOS transistor, but also reduce the resistance; in addition, the first conductive channel is formed by using the sidewall as the mask and adopting the self-alignment process, so that the distance between the source region and the gate electrode can be ensured to be equal to the width of the sidewall, the lateral body resistance under the source region is reduced, and an improvement of EAS (avalanche energy) is facilitated; and the field plate is directly contacted with the upper surface of the first conductive channel, so that the field plate and the upper surface of the first conductive channel are better in contact, the stability of the process is improved, and the product performance is improved.

FIGS. 3a to 3j show sectional views of stages in the manufacture of an LDMOS transistor according to an embodiment of the present disclosure.

Figure 3A:
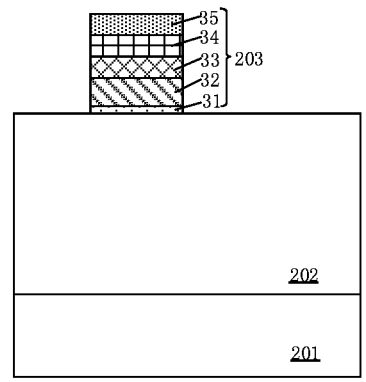
FIGS. 3a to 3j show sectional views of stages in the manufacture of an LDMOS transistor according to an embodiment of the present disclosure.

As shown in FIG. 3a, the epitaxial layer 202 is formed on the upper surface of the substrate 201. By means of thermal oxidation, the gate dielectric layer 31 is formed on the upper surface of the epitaxial layer 202, the gate conductor 32 is formed on the gate dielectric layer 31, the silicide layer 33 is formed on the gate conductor 32, the third insulating layer 34 is formed on the silicide layer 33, and the first barrier layer 35 is formed on the third insulating layer 34. The gate dielectric layer 31, the gate conductor 32, the silicide layer 33, the third insulating layer 34, and the first barrier layer 35 are further etched to form the gate structure 203 using a conventional etching processes so that the gate structure 203 is located on a part of the upper surface of the epitaxial layer 202. The gate dielectric layer 31 and the third insulating layer 34 may be formed by oxide, such as silicon oxide. The silicide layer 33 may include a silicide including a transition metal, such as Ti, W, or the like. The first barrier layer 35 may be formed by a nitride, for example, silicon nitride.

Figure 3B:
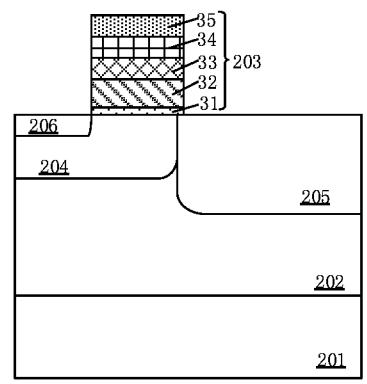

Subsequently, as shown in FIG. 3b, using the gate structure 203 as a mask, N-type ions are implanted through a self-aligned process to form the drift region 205 in the epitaxial layer 202, wherein the drift region 205 is located in the second region of the epitaxial layer 202. By adopting the gate structure 203 as a mask, P-type ions are implanted through the self-aligned process to form the body region 204 in the epitaxial layer 202, wherein the body region 204 is located in the first region of the epitaxial layer 202; thermal treatment such as annealing is then used to cause the body region 204 formed to diffuse in the epitaxial layer 202, extending below the gate structure 203 and eventually contacting the drift region 205. Source regions 206 are formed in body region 204 using N-type ion implantation, source regions 206 are located within the first region of epitaxial layer 202, and body region 204 isolates source regions 206 from drift region 202.

Figure 3C:
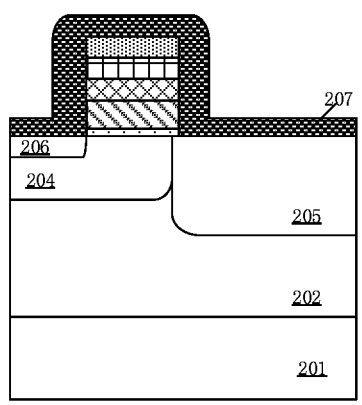

Subsequently, as shown in FIG. 3c, the first insulating layer 207 is deposited on the epitaxial layer 202 and the gate structure 203 so that the first insulating layer 207 covers the upper surface of the epitaxial layer 202, the upper surface of the gate structure 203 and the side surfaces of the gate structure 203. A shape of the first insulating layer 207 corresponds to a structure of the gate structure 203 and the upper surface of the epitaxial layer 202, and specifically, the first insulating layer 207 may be an oxide layer.

Figure 3D:
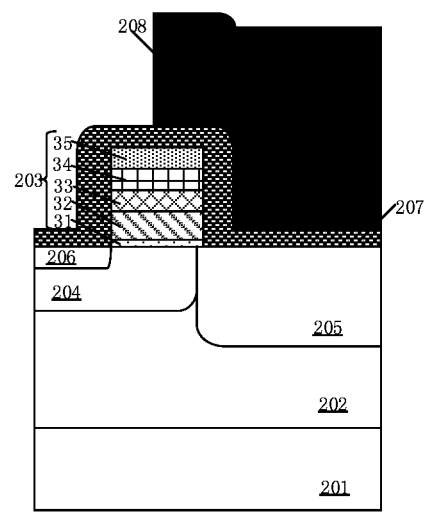

Subsequently, as shown in FIG. 3d, a mask layer is formed on the first insulating layer 207 and the mask layer is etched to form the patterned mask layer 208, wherein the patterned mask layer 208 exposes the first insulating layer 207 above the source region 206 and above a part of the gate structure 203. The mask layer may be a photoresist.

Figure 3E:
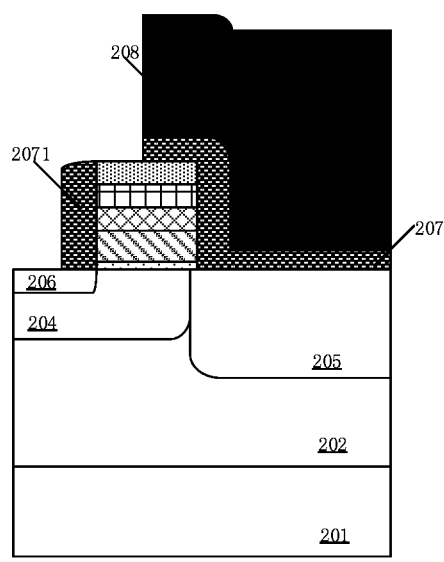

Subsequently, as shown in FIG. 3e, the first insulating layer 207 exposed by the patterned mask layer 208 is partially etched to form sidewall 2071 covering the side surfaces of the gate structure. The etching is anisotropic etching. Specifically, the first insulating layer 207 is etched by using the patterned mask layer 208 as a mask until the first insulating layer 207 exposed by the patterned mask layer 208 above the gate structure is completely etched, so as to form the sidewall 2071 covering the side surface of the gate structure.

Figure 3F:
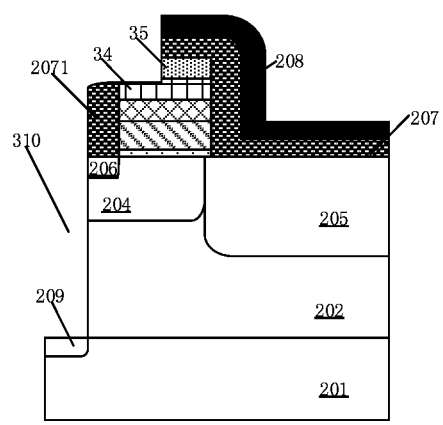

Subsequently, as shown in FIG. 3f, the epitaxial layer 202 is self-aligned etched using the sidewall 2071, the gate structure 203, and the patterned mask layer 208 as masks to form a first trench 310. The etching is anisotropic etching. The first trench 310 pass through source regions 206, body region 204, and epitaxial layer 202 in sequence to the upper surface of substrate 201 so that a part of the upper surface of substrate 201 is exposed by the first trench 310, and then the body contact region 209 is formed in substrate 201 using P-type ion implantation.

When the epitaxial layer 202 is etched, the sidewall 2071, a part of the gate structure 203, and the patterned mask layer 208 are also partially etched. Specifically, the first barrier layer 35 of the exposed part of the gate structure of the first insulating layer 207 is etched, and further, the third insulating layer 34 is also partially etched. Wherein the first barrier layer is preferably nitride, such as silicon nitride. Materials of the epitaxial layer and the first barrier layer have high etching selectivity ratio.

Finally, the patterned mask layer 208 remaining on the first insulating layer 207 is removed.

Of course, in another embodiment, the patterned mask layer 208 may also expose only the first insulating layer on the source region, and then etch the first insulating layer above the source region 206 to form the sidewall 2071 covering the side surface of the gate structure. Then the upper surface of the gate structure is not etched during the formation of the first trench because it is covered by the patterned masking layer 208. The specific process is not limited herein as long as the first trench is formed by self-alignment using the sidewall as a mask, and the first conductive channel is formed.

Figure 3G:
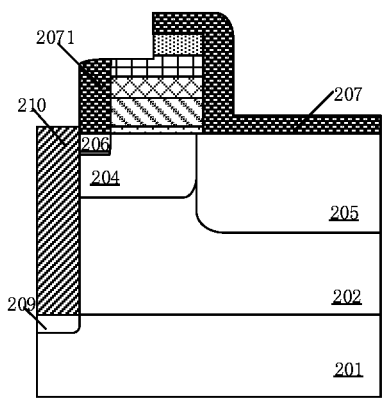

Subsequently, as shown in FIG. 3g, a conductive material is filled into the first trench 310 to form the first conductive channel 210. Specifically, the conductive material is first deposited on the first trench 310 and the first insulating layer 207 so that the conductive material fills the first trench, and then the deposited conductive material is etched back to remove the conductive material outside the first trench, thereby forming the first conductive channel 210 in the first trench. In one embodiment, the first conductive channel 210 passes through the source region 206, the body region 204 and the epitaxial layer 202 to reach the upper surface of the substrate 201, that is, one end of the first conductive channel 210 reaches the upper surface of the substrate 201 and contacts the body contact region 209, and the other end reaches the upper surface of the source region, so that the first conductive channel 210 connects the source region 230 with the substrate 100. Preferably, the other end of the first conductive channel 210 may extend to contact with the sidewall 2071.

Figure 3H:
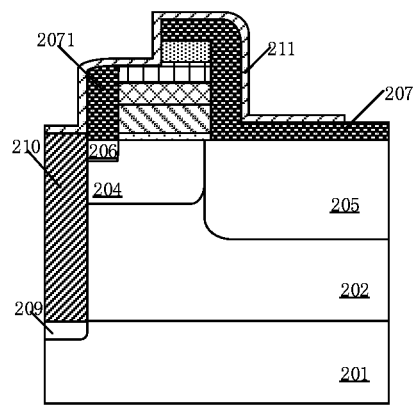

Subsequently, as shown in FIG. 3h, the conductive material is deposited on the first conductive channel 210, the first insulating layer 207 and the gate structure 203 to form the shielding conductive layer 211, that is, the shielding conductive layer 211 is in contact with the upper surface of the first conductive channel 210, the sidewall 2071, the upper surface of the third insulating layer, the side surface of the first barrier layer and the upper surface of the patterned first insulating layer 207 in sequence. The shield conductor layer 211 serves as the field plate of the LDMOS transistor, and the shield conductor layer 211 exposes a part of the first insulating layer 207 above the drift region 205. The contact of the first conductive channel 210 with the shield conductor layer 211 causes the field plate potential of the LDMOS transistor to be the same as the potential of the source region 206 of the LDMOS transistor, for example, both at ground potential. In this embodiment, the shielding conductor layer 211 is preferably polysilicon or tungsten, of course, other conductive materials may be selected.

Figure 3I:
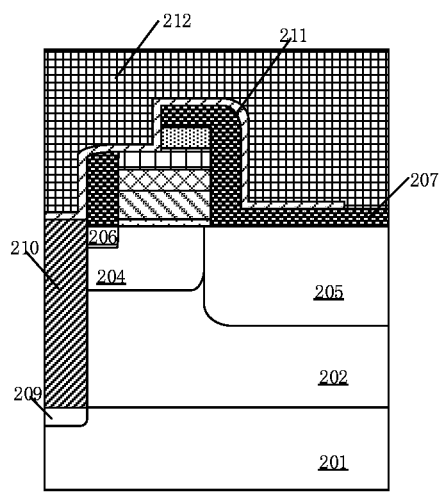

Subsequently, as shown in FIG. 3i, the second insulating layer 212 is deposited on the shielding conductor layer 211 and the first insulating layer 207, the second insulating layer 212 covering the upper surfaces of the shielding conductor layer 211 and the first insulating layer 207. The second insulating layer 212 may be the oxide layer.

Figure 3J:
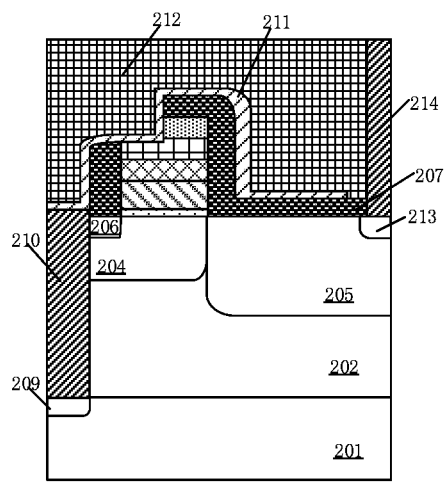

Subsequently, as shown in FIG. 3j, the first insulating layer 207 and the second insulating layer 212 on the upper surface of the second region of the epitaxial layer 202 are etched by using the etching process, so that a part of the upper surface of the second region of the epitaxial layer 202 is exposed to form a second trench. The second trench extends from the second insulating layer 212 to the direction of the epitaxial layer 202, and sequentially passes through the second insulating layer 212 and the first insulating layer 207 to reach the surface of the drift region 205, that is, one end of the second trench reaches the upper surface of the second insulating layer 212, and the other end of the second trench reaches the upper surface of the epitaxial layer 202. A drain region 213 is formed in the exposed epitaxial layer 202 by N-type ion implantation, the drain region 213 being located in the drift region 205 and in the second region of the epitaxial layer 202.

Subsequently, the conductive material is deposited into the second trench to form the second conductive channel 214. One end of the second conductive channel 214 reaches the upper surface of the second insulating layer 212 and the other end reaches the upper surface of the epitaxial layer 202 and contacts the drain region 213.

Subsequently, as shown in FIG. 2, the drain electrode 215 is formed on the upper surface of the second insulating layer 212, and the second conductive channel 214 connects the drain electrode 215 with the drain region 213.

A lower surface of the substrate 201 is thinned by a thinning technique, and then a metal layer is deposited on the lower surface to form the source electrode 216, and the source electrode 216 is electrically connected to the source region 206 and the shielding conductor layer 211 through the first conductive channel 210.

In the above-described embodiments, the first conductive channel 210, the second conductive channel 214, the source electrode 215, the gate conductor 32, the shielding conductor layer 211, and the drain electrode 216 may be respectively formed by a conductive material including a metal material such as aluminum alloy or copper.

According to the method for manufacturing the LDMOS transistor, the first conductive channel is formed by using the sidewall as the mask and adopting the self-alignment process, so that the distance between the source region and the gate electrode can be ensured to be equal to the width of the sidewall, the lateral body resistance under the source region is reduced, and an improvement of EAS (avalanche energy) is facilitated; meanwhile, alignment deviation between the first conductive channel and the gate electrode is effectively avoided, and problem of process consistency is solved; and the field plate is directly contacted with the upper surface of the first conductive channel, so that the field plate and the upper surface of the first conductive channel are better in contact, the stability of the process is improved, and the product performance is improved.

It is noted that, herein, relational terms such as first and second, and the like may be used solely to distinguish one entity or action from another entity or action without necessarily requiring or implying any actual such relationship or order between such entities or actions. Also, the terms "comprises," "comprising," or any other variation thereof, are intended to cover a non-exclusive inclusion, so that a process, method, article, or apparatus that comprises a list of elements does not include only those elements but may include other elements not expressly listed or inherent to such process, method, article, or apparatus. Without further limitation, an element defined by the phrase "comprising an . . . " does not exclude the presence of other identical elements in a process, method, article, or apparatus that comprises the element.

While embodiments in accordance with the disclosure have been described above, these embodiments are not intended to be exhaustive or to limit the disclosure to the precise embodiments described. Obviously, many modifications and variations are possible in light of the above teaching. The embodiments were chosen and described in order to best explain the principles of the disclosure and the practical disclosure, to thereby enable others skilled in the art to best utilize the disclosure and various embodiments with various modifications as are suited to the particular use contemplated. The disclosure is limited only by the claims and their full scope and equivalents.

What is claimed is:

1. An LDMOS transistor comprising:
an epitaxial layer on a substrate of a first doping type;
a gate structure on an upper surface of the epitaxial layer;
a source region of a second doping type in the epitaxial layer, wherein the second doping type is opposite to the first doping type;
a patterned first insulating layer on the upper surface of the epitaxial layer and the gate structure, wherein the patterned first insulating layer at least comprises a sidewall covering a side surface of the gate structure close to the source region;
a first conductive channel extending from the source region to an upper surface of the substrate, wherein the source region is connected with the substrate through the first conductive channel;
a shield conductor layer covering the first conductive channel and the patterned first insulating layer; and
a drain region in the epitaxial layer,
wherein the gate structure comprises:
a gate dielectric layer on the upper surface of the substrate, a gate conductor on the gate dielectric layer, a silicide layer on the gate conductor, a third insulating layer on the silicide layer, and a first barrier layer on the third insulating layer, at least dimensions of the gate dielectric layer, the gate conductor, the silicide layer and the third insulating layer correspond, and
wherein the shield conductor layer is sequentially in contact with an upper surface of the first conductive channel, the sidewall, an upper surface of the third insulating layer, a side surface of the first barrier layer, an upper surface of the patterned first insulating layer.

2. The LDMOS transistor according to claim 1, wherein the first conductive channel is formed self-aligned by use of the sidewall as a mask.

3. The LDMOS transistor according to claim 1, wherein the patterned first insulating layer exposes at least part of an upper surface of the gate structure.

4. The LDMOS transistor according to claim 1, wherein the first conductive channel is in contact with prat part of a side surface of the sidewall.

5. The LDMOS transistor according to claim 1, wherein the shield conductor layer exposes the patterned first insulating layer close to the drain region.

6. The LDMOS transistor according to claim 1, wherein further comprising:
a body contact region of the first doping type in the substrate, the first conductive channel connecting the body contact region and the source region.

7. The LDMOS transistor according to claim 1, wherein further comprising: a body region of the first second doping type in a first region of the epitaxial layer extending from the upper surface of the epitaxial layer to an interior of the epitaxial layer, wherein the source region is located in the body region, and the body region at least partially extends to the epitaxial layer below the gate structure.

8. The LDMOS transistor according to claim 1, wherein further comprising: a drift region of the second doping type in a second region of the epitaxial layer extending from the upper surface of the epitaxial layer to an interior of the epitaxial layer, wherein the drain region is located in the drift region.

9. The LDMOS transistor according to claim 1, wherein further comprising:
a second insulating layer on the shielding conductor layer and the patterned first insulating layer;
a drain electrode on an upper surface of the second insulating layer; and
a second conductive channel connecting the drain region and the drain electrode, the second conductive channel extending from the second insulating layer to the drain region.

10. The LDMOS transistor according to claim 1, wherein the gate dielectric layer, the gate conductor, the silicide layer and the third insulating layer is of a same width, and a width of the first barrier layer is less than a width of the third insulating layer.

11. The LDMOS transistor according to claim 1, wherein part of an upper surface of the third insulating layer close to the source region is exposed by the first barrier layer.

12. The LDMOS transistor according to claim 1, wherein the first barrier layer is a nitride.

13. The LDMOS transistor according to claim 1, wherein further comprising: a source electrode located on a lower surface of the substrate.

* * * * *